(12) United States Patent
Furihata et al.

(10) Patent No.: US 7,404,885 B2
(45) Date of Patent: Jul. 29, 2008

(54) PLATING METHOD AND ELECTRONIC DEVICE

(75) Inventors: Hidemichi Furihata, Chino (JP); Satoshi Kimura, Fujimi (JP)

(73) Assignee: Seiko Epson Corporation (JP)

( * ) Notice: Subject to any disclaimer, the term of this patent is extended or adjusted under 35 U.S.C. 154(b) by 149 days.

(21) Appl. No.: 11/370,570

(22) Filed: Mar. 8, 2006

(65) Prior Publication Data

US 2006/0231408 A1 Oct. 19, 2006

(30) Foreign Application Priority Data

Apr. 13, 2005 (JP) ............................. 2005-115411

(51) Int. Cl.
*C25D 5/00* (2006.01)
*C25D 7/00* (2006.01)

(52) U.S. Cl. .................... 205/80; 205/91; 205/143; 205/148; 205/149; 205/152; 427/289

(58) Field of Classification Search ............... None
See application file for complete search history.

(56) References Cited

U.S. PATENT DOCUMENTS

| 4,622,069 | A | * | 11/1986 | Akai et al. ................. 106/1.11 |
| 4,867,811 | A | * | 9/1989 | Wakiyama et al. .......... 148/277 |
| 6,212,769 | B1 | * | 4/2001 | Boyko et al. ................. 29/852 |
| 2004/0118690 | A1 | * | 6/2004 | Yoshitani ..................... 205/91 |

FOREIGN PATENT DOCUMENTS

| EP | 0817549 | 1/1998 |
| JP | 08-064934 | 3/1996 |
| JP | 09-078250 | 3/1997 |
| JP | 10-075038 | 3/1998 |
| JP | 10-272727 | 10/1998 |

* cited by examiner

*Primary Examiner*—Duy-Vu N Deo
(74) *Attorney, Agent, or Firm*—Harness, Dickey & Pierce, P.L.C.

(57) ABSTRACT

A plating method includes the steps of (a) forming a roughened area in a predetermined area of a substrate, (b) forming a surface-active agent layer above at least the roughened area, (c) forming, above the roughened area, a catalyst layer above the surface-active agent layer, and (d) precipitating a metal layer above the catalyst layer.

8 Claims, 3 Drawing Sheets

PLATING METHOD AND ELECTRONIC DEVICE

The entire disclosure of Japanese Patent Application No. 2005-115411, filed Apr. 13, 2005 is expressly incorporated by reference herein.

BACKGROUND

1. Technical Field

The present invention relates to plating methods and electronic devices.

2. Related Art

A subtractive method and an additive method are known as a method for forming wiring patterns. In the subtractive method, a metal layer is formed over the entire surface of a substrate, a photoresist is formed on the metal layer by patterning, and the metal layer is etched by using the photoresist as a mask. In the additive method, a photoresist is formed on a substrate by patterning, and a metal layer is deposited by a plating process in an opening section in the photoresist. These methods may entail problems concerning consumptions of resources and raw material, in view of the fact that the photoresist is finally removed, and further in view of the fact that a part of the metal layer is removed in the subtractive method. Also, they require the steps of forming and removing a photoresist, which results in a large number of manufacturing steps. Furthermore, the solvent that is used to remove the photoresist may possibly remove, for example, the catalyst, too. An example of related art is described in Japanese laid-open patent application JP-A-8-64934.

In accordance with an advantage of some aspects of the present invention, a plating method that can improve the reliability of devices with a relatively simple process, and devices manufactured by the plating method can be provided.

(1) A plating method in accordance with an embodiment of the invention includes the steps of: (a) forming a roughened area in a predetermined area of a substrate; (b) forming a surface-active agent layer above at least the roughened area; (c) forming, above the roughened area, a catalyst layer above the surface-active agent layer; and (d) precipitating a metal layer above the catalyst layer.

According to the embodiment of the invention, because the metal layer is formed above the roughened area of the substrate, adhesion between the substrate and the metal layer can be improved and the reliability can be improved. Also, surfaces of the substrate other than the area of the metal layer are not roughened, such that the strength of the substrate is not impaired, and therefore the area that is not roughened can be used for a wide variety of purposes. Moreover, for example, the use of photoresist can be omitted, such that a metal layer can be formed with a relatively simple process. It is noted that, in the invention, the case where B is provided above a specific A includes the case where B is provided directly on A, and the case where B is provided above A through another member. The same applies to other embodiments of the invention to be described below.

(2) In the plating method, the step (a) may include forming another surface-active agent layer other than the predetermined area of the substrate, and etching the substrate by wet-etching to thereby form the roughened area.

(3) In the plating method, the substrate may exhibit a first polarity, and the surface-active agent layer and the other surface-active agent layer may exhibit a second polarity.

(4) The plating method may further include removing the other surface-active agent layer before the step (b), and patterning the surface-active agent layer to be remained only above the roughened area in the step (b).

(5) In the plating method, the step (b) may include patterning the surface-active agent layer by light irradiation in a manner that the surface-active agent layer remains only above the roughened area, and removing the other surface-active agent layer by the light irradiation.

(6) In the plating method, the substrate and the other surface-active agent layer may exhibit a first polarity, and the surface-active agent layer may exhibit a second polarity.

(7) In the plating method, an absolute value of the first polarity of the other surface-active agent layer may be greater than that of the substrate.

(8) In the plating method, in the step (b), the surface-active agent layer may be formed above the roughened area and above the other surface-active agent layer.

An electronic device in accordance with an embodiment of the invention includes a wiring pattern, wherein the wiring pattern is formed by the plating method described above.

DESCRIPTION OF EXEMPLARY EMBODIMENTS

Preferred embodiments of the invention are described below with reference to the accompanying drawings.

First Embodiment

FIG. 1-FIG. 8 show a plating method in accordance with a first embodiment of the invention. In the present embodiment, a metal layer (wiring pattern) is formed on a substrate by an electroless plating method.

Figure 1:
FIG. 1 is a view showing a step of a plating method in accordance with a first embodiment of the invention.

(1) As shown in FIG. 1, a substrate 10 is prepared. The substrate 10 shown in FIG. 1 may be an insulating substrate.

The substrate 10 may be an organic material substrate (such as, for example, a plastic material substrate or a resin substrate), or an inorganic material substrate (such as, for example, a silica glass plate, a silicon wafer or an oxide layer). As the plastic material, polyimide, polyethylene terephthalate, polycarbonate, and the like can be enumerated. The substrate 10 may be a light transmissive substrate (for example, a transparent substrate). The substrate 10 may be in a single layer, or in a multilayer in which at least one insulating layer is formed on a base substrate. In the present embodiment, a metal layer is formed on the substrate 10.

First, the substrate 10 is washed. The substrate 10 may be washed by either dry washing or wet washing. Concretely, for example, by using a vacuum ultraviolet ray lamp (with a wavelength of 172 nm, an output of 10 mW, and a lamp-to-substrate distance of 1 mm), the dry etching on the substrate 10 can be conducted in a nitrogen atmosphere for 30 seconds-900 seconds by irradiating vacuum ultraviolet ray. In the case of the wet etching, the substrate 10 may be dipped in ozone water (with an ozone concentration of 10 ppm-20 ppm) for 5 minutes-30 minutes at room temperature, to thereby wash the substrate 10. As a result, dirt such as grease adhered to the surface of the substrate 10 can be removed. Also, the surface of the substrate 10 can be changed from water-repelling property to hydrophilic property. Furthermore, if the surface potential in liquid of the substrate 10 is a negative potential (i.e., first polarity), a uniform negative potential surface can be formed on the substrate 10 by washing the substrate 10.

Figure 2:
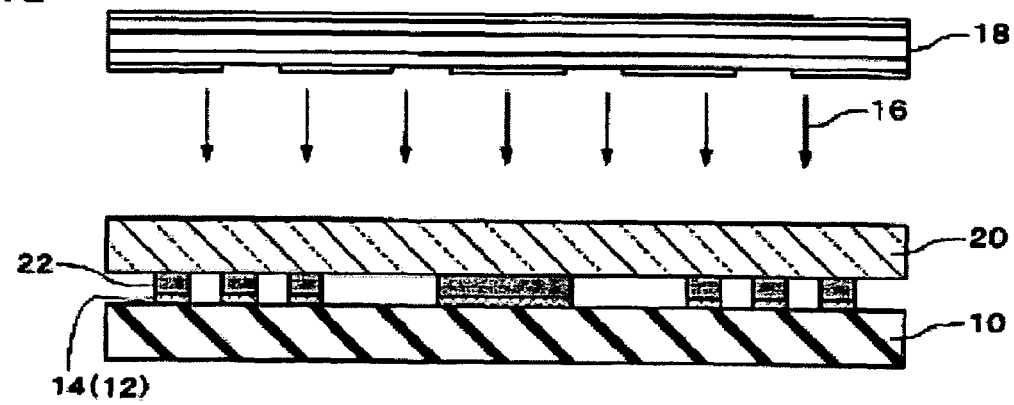
FIG. 2 is a view showing a step of the plating method in accordance with the first embodiment of the invention.

(2) Next, as shown in FIG. 1 and FIG. 2, a first surface-active agent layer 14 is formed on the substrate 10 by patterning. For example, the first surface-active agent layer 14 can be formed by patterning with light irradiation.

Concretely, the substrate 10 is dipped, for example, in a surface-active agent solution containing surface-active agent composition, thereby forming a first surface-active agent layer 12 over the entire surface of the substrate 10, as shown in FIG. 1. When the surface potential in liquid of the substrate 10 is a negative potential (first polarity), a surface-active agent layer that exhibits a positive potential (second polarity) can be used as the first surface-active agent layer 12. More concretely, for example, a cationic system surface-active agent (a cation surface-active agent or one having a property equal to the same) can be used as the first surface-active agent layer 12. As the surface-active agent solution, for example, a water-soluble surface-active agent containing aminosilane composition (e.g., FPD conditioner manufactured by Technic Japan Inc.), an alkylammonium solution (for example, cetyltrimethylammonium chloride, or the like), or the like can be used. The dipping time may be, for example, about 1 minute-3 minutes.

Then, the substrate 10 is taken out from the surface-active agent solution, and washed with ultrapure water. Then, the substrate to may be naturally dried at room temperature, or water droplets on the substrate 10 may be removed by blowing compresses air, and then the substrate 10 is placed and dried in an oven at 90° C.-120° C. for about 3 hours.

Then, as shown in FIG. 2, the first surface-active agent layer 12 is patterned, whereby a first surface-active agent layer 14 is formed in a predetermined pattern area on the substrate 10. In other words, the first surface-active agent layer 12 in an area other than the pattern area on the substrate 10 is photodecomposed and removed by patterning, for example, with light 16.

As the light 16, vacuum ultraviolet (VUV) ray may be used. By setting the light 16, for example, to a wavelength of 170 nm-260 nm, the interatomic bonds (such as, for example, C—C, C=C, C—H, C—F, C—Cl, C—O, C—N, O=O, O—H, H—F, H—Cl, and N—H) can be broken down. By this, the first surface-active agent layer 12 can be photodecomposed. Also, by using the light 16 in the aforementioned wavelength band, facility such as an yellow room becomes unnecessary, and the series of steps in accordance with the present embodiment can be conducted in, for example, white light.

Concretely, the light 16 may be irradiated by using, for example, a vacuum ultraviolet ray lamp (with a wavelength of 172 nm, an output of 10 mW, and a lamp-to-target distance of 1 mm) as a light source 18, in a nitrogen atmosphere for 5 minutes-30 minutes. The light source 18 may be an excimer lamp enclosing Xe gas therein. The light 16 may have any wavelength without any particular limitation as long as the light 16 can photodecompose the first surface-active agent layer 12.

The light 16 is irradiated to the substrate 10 through a mask 20 (for example, a photomask). More specifically, the mask 20 is disposed between the light source 18 and the substrate 10, such that the light 16 is passed through an area other than a light shielding area 22 (for example, a metal pattern section formed with chrome or the like) of the mask 20. In the present embodiment, a metal layer is formed in an area other than the pattern area of the first surface-active agent layer 14, such that the light shielding section 22 has a configuration reversed and plane-symmetrical with respect to the pattern configuration of the metal layer. The mask 20 may be disposed in contact with the substrate 10. Also, the light irradiation process may preferably be conducted in a nitrogen atmosphere, because the light 16 is difficult to be attenuated therein.

In this manner, the first surface-active agent layer 14 having a predetermined pattern configuration can be formed.

Figure 3:
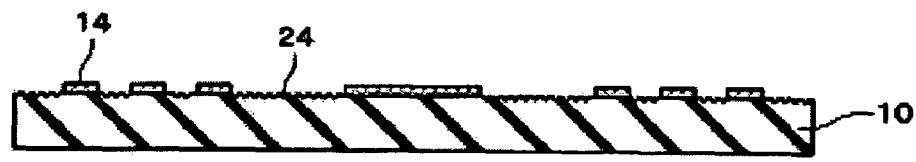
FIG. 3 is a view showing a step of the plating method in accordance with the first embodiment of the invention.

(3) Next, as shown in FIG. 3, wet etching is conducted to form a roughened area 24 on the substrate 10. The roughened area 24 is formed in an area that is exposed through the first surface-active agent layer 14. The roughened area 24 has a reverse configuration with respect to the pattern configuration of the first surface-active agent layer 14. It is noted that the other area of the substrate 10 (i.e., an area other than the roughened area 24) is covered by the first surface-active agent layer 14, such that the surface in the other area would not be roughened, and can be formed in, for example, a flat plane.

In the wet etching step, an etching liquid is used. The etching liquid may be acidic or alkaline depending on the material of the substrate 10. For example, if the substrate 10 is an inorganic substrate such as a silica glass substrate, an acidic solution may be used. If the substrate 10 is an organic substrate such as a polyimide substrate, an alkaline solution can be used. The wet etching method may be a dipping method in which the substrate 10 is dipped in an etching liquid, or a coating method in which an etching liquid may be coated on the substrate 10 by shower or spray. By wet etching the substrate 10, residues of the first surface-active agent layer 14 on the roughened area 24 can be removed.

Figure 4:
FIG. 4 is a view showing a step of the plating method in accordance with the first embodiment of the invention.
Figure 5:
FIG. 5 is a view showing a step of the plating method in accordance with the first embodiment of the invention.
Figure 6:
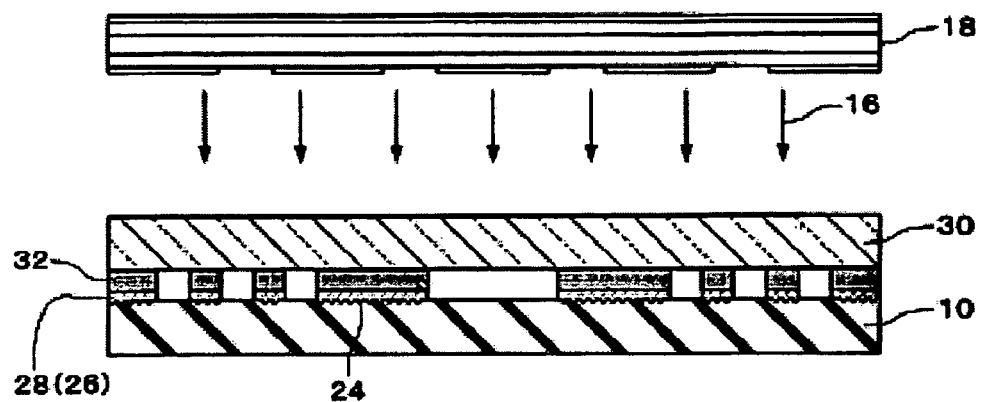
FIG. 6 is a view showing a step of the plating method in accordance with the first embodiment of the invention.

(4) Next, as shown in FIG. 4-FIG. 6, a second surface-active agent layer 28 is formed at least on the roughened area 24 of the substrate 10. In the present embodiment, the second surface-active agent layer 28 is formed to be remained only on the roughened area 24 by patterning.

As shown in FIG. 4, before forming the second surface-active agent layer 28, the first surface-active agent layer 14 may be removed. The first surface-active agent layer 14 may be decomposed and removed by irradiating light to the entire surface of the substrate 10. The light irradiation may be conducted in the manner described in detail above. Then, the substrate 10 may be subject to a washing step if necessary, whereby residues of the first surface-active agent layer 14 can be removed.

Then, for example, the substrate 10 may be dipped in a surface-active agent solution containing surface-active agent composition, whereby a second surface-active agent layer 26 is formed on the entire surface of the substrate 10. As the second surface-active agent layer 26, a surface-active agent having a property that exhibits the same polarity as that of the first surface-active agent layer 14 described above can be used. For example, a cationic system surface-active agent may be used. The details of the surface-active agent material described above are also applicable in this embodiment.

Then, after conducting washing and drying steps if necessary, the second surface-active agent layer 26 is patterned, thereby forming the second surface-active agent layer 28 on the roughened area 24 of the substrate 10. In other words, the second surface-active agent layer 26 in an area other than the roughened area 24 of the substrate 10 is photodecomposed and removed by patterning. In the present step, the patterning step with light irradiation described above can be applied. The details of the patterning step described above may also be applicable in the present step, but the present step uses a mask 30 with a light shielding section 32 having a configuration plane-symmetrical with respect to the pattern configuration of the metal layer (i.e., the roughened area 24).

Figure 7:
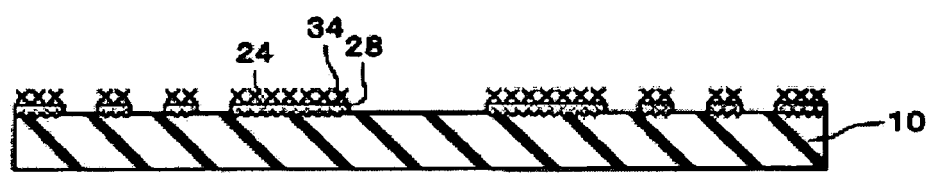
FIG. 7 is a view showing a step of the plating method in accordance with the first embodiment of the invention.

(5) Next, as shown in FIG. 7, a catalyst layer 34 is formed on the second surface-active agent layer 28. As the second surface-active agent layer 28 is formed only on the roughened area 24 of the substrate 10, the catalyst layer 34 can be formed only on the roughened area 24.

Concretely, the substrate 10 is dipped in a catalyst solution containing catalyst composition. When a cationic system surface-active agent is used as the second surface-active agent layer 28, a catalyst whose potential in liquid exhibits a negative potential (first polarity) can be selected. By this, the catalyst can be selectively adsorbed onto the second surface-active agent layer 28, such that the catalyst layer 34 can be formed only on the second surface-active agent layer 28. The catalyst layer 34 causes precipitation of a metal layer 36 in an electroless plating liquid, and can be composed of, for example, palladium. When the amount of catalyst to be adsorbed to the second surface-active agent layer 28 is increased, the amount of the metal layer 36 to be precipitated on the catalyst layer 34 is increased (i.e., the precipitation rate becomes greater). Therefore, by adjusting the amount of catalyst, the thickness of the metal layer 36 can be controlled. As the catalyst liquid, tin-palladium colloidal catalyst liquid may be enumerated. However, other catalyst liquid can be freely selected depending on the material of the metal layer 36 without any particular limitation to the above. It is noted that, when the substrate 10 is dipped in tin-palladium colloidal catalyst liquid, the substrate 10 may be dipped in a fluoroborate acid solution to activate the catalyst. In this manner, tin colloidal particles are removed, and palladium alone can be adsorbed to the second surface-active agent layer 28.

Figure 8:
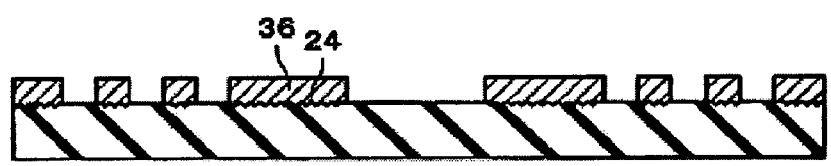
FIG. 8 is a view showing a step of the plating method in accordance with the first embodiment of the invention.

(6) Next, as shown in FIG. 8, a metal layer 36 is precipitated on the catalyst layer 34. As described above, the catalyst layer 34 is formed only on the roughened area 24, such that the metal layer 36 can be formed only on the roughened area 24.

Concretely, by dipping the substrate in an electroless plating liquid, the metal layer 36 can be precipitated on the catalyst layer 34. If a nickel layer is to be precipitated as the metal layer 36, an electroless plating liquid mainly containing nickel sulfate hexahydrate with sodium hypophosphite included therein as a reducing agent may be used. For example, by dipping the substrate 10 in such an electroless plating liquid (at 80° C.) for about 1 minute, a nickel layer having a thickness of 0.05 µm-0.08 µm can be formed. Alternatively, an electroless plating liquid mainly containing nickel chloride hexahydrate with sodium hypophosphite included therein as a reducing agent may be used. For example, by dipping the substrate 10 in such an electroless plating liquid (at 60° C.) for about 1 minute, a nickel layer having a thickness of 0.05 µm-0.08 µm can be formed. Without being limited to any particular material, the metal layer 36 can be formed with, for example, platinum (Pt), copper (Cu), gold (Au) or the like.

In this manner, the metal layer 36 can be formed on the substrate 10. Because the metal layer 36 is formed on the roughened area 24 in which the surface of the substrate 10 is roughened, the bonding strength of the metal layer 36 to the substrate 10 can be enhanced. In other words, fine irregularities of the roughened area 24 physically engage the metal layer 36, such that its anchor effect can be improved more than the case of the metal layer 36 being formed on a flat surface. It is noted that illustration of the second surface-active agent layer 28 and the catalyst layer 34 is omitted in FIG. 8.

According to the plating method in accordance with the present embodiment, the metal layer 26 is formed above the roughened area 24 of the substrate 10, such that the adhesion between the substrate 10 and the metal layer 36 (more specifically, the second surface-active agent layer 28) can be improved, and their reliability can be improved. Also because surface areas of the substrate 10 other than the area of the metal layer 36 are not roughened, the strength of the substrate 10 would not be harmed, and the surface areas can be used for a wide variety of purposes. More specifically, for example, other wirings can be formed with a high reliability in areas other than the metal layer 36, and when the substrate 10 is a light transmissive substrate, the substrate 10 can transmit light with a high transmittivity. Accordingly, the degree of freedom in design can be improved. Furthermore, for example, the use of photoresist can be omitted, such that a metal layer can be formed with a relatively simple process.

In the example described above, the first surface-active agent layer 14 is removed before forming the second surface-active agent layer 28. However, the embodiment is not limited to this procedure. For example, by the light irradiation conducted for patterning and forming the second surface-active agent layer 28, the first surface-active agent layer 14 can be decomposed and removed at the same time. According to this procedure, patterning of the second surface-active agent layer 28 and removal of the first surface-active agent layer 14 can be conducted by a common step, such that the process can be further simplified.

Second Embodiment

FIG. 9-FIG. 14 are views showing a plating method in accordance with a second embodiment of the invention. In the present embodiment, first and second surface-active agent layers having properties that exhibit different polarities are used.

(1) The substrate 10 described above is prepared. For example as the substrate 10, a substrate whose surface potential in liquid exhibits a negative potential (first polarity) may be used. Also, by washing the substrate 10, a uniform negative potential surface can be formed on the substrate 10. The surface potential of the substrate 10 in this embodiment is assumed to be $-V_1$ (mV) (for example, −50 mV).

Figure 9:
FIG. 9 is a view showing a step of a plating method in accordance with a second embodiment of the invention.
Figure 10:
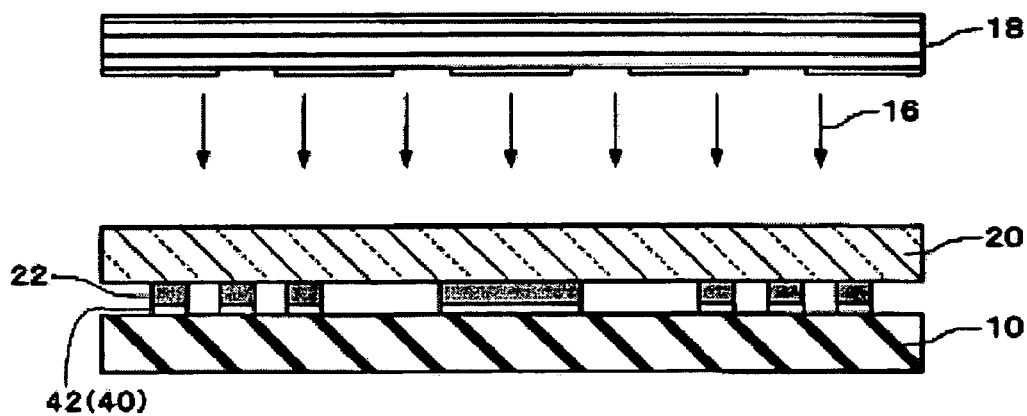
FIG. 10 is a view showing a step of the plating method in accordance with the second embodiment of the invention.

(2) Next, as shown in FIG. 9 and FIG. 10, a first surface-active agent layer 42 is formed on the substrate 10 by patterning. For example, the first surface-active agent layer 42 can be formed by patterning with light irradiation.

Concretely, the substrate 10 is dipped, for example, in a surface-active agent solution containing surface-active agent composition, thereby forming a first surface-active agent layer 40 over the entire surface of the substrate 10, as shown in FIG. 9. As the first surface-active agent layer 40, a surface-active agent that exhibits the same polarity as that of the substrate 10 can be used. When the surface potential of the first surface-active agent layer 40 of this embodiment is $-V_2$ (mV) (for example, $-150$ mV), a relation $|V_2|>|V_1|$ can be established. In other words, the first surface-active agent layer 40 has a property in which an absolute value of the first polarity is greater than that of the substrate 10 (for example, two or three times greater or more). As the first surface-active agent layer 40, for example, an anionic system surface-active agent (an anionic surface-active agent or one having a property equal to the same) may be used. In this case, it can be said that the first surface-active agent layer 40 has a property that exhibits a stronger negative surface potential than that of the substrate 10. As the surface-active agent solution, for example, a solution of water soluble surface-active agent containing alkylsulfate composition (e.g., sodium dodecyl sulfate), N-Lauroylsarcosine containing soap composition or the like can be used.

Then, the substrate 10 is taken out from the surface-active agent solution, and washed with ultrapure water. Then, the substrate 10 may be naturally dried at room temperature, or water droplets on the substrate 10 may be removed by blowing compresses air, and then the substrate 10 is placed and dried in an oven at 90° C.-120° C. for about 3 hours.

Then, as shown in FIG. 10, the first surface-active agent layer 40 is patterned, whereby a first surface-active agent layer 42 is formed in a predetermined pattern area on the substrate 10. In other words, the first surface-active agent layer 40 in an area other than the pattern area on the substrate 10 is photodecomposed and removed by patterning. In the present step, the patterning step with light irradiation described above in the first embodiment can be used, and the same details described above can be applied.

Figure 11:
FIG. 11 is a view showing a step of the plating method in accordance with the second embodiment of the invention.

(3) Next, as shown in FIG. 11, wet etching is conducted to thereby form a roughened area 24 on the substrate 10. The details described above in the first embodiment can be applied to the present etching step. By conducting wet etching, the roughened area 24 is formed and also residues of the first surface-active agent layer 42 on the roughened area 24 can be removed.

Figure 12:
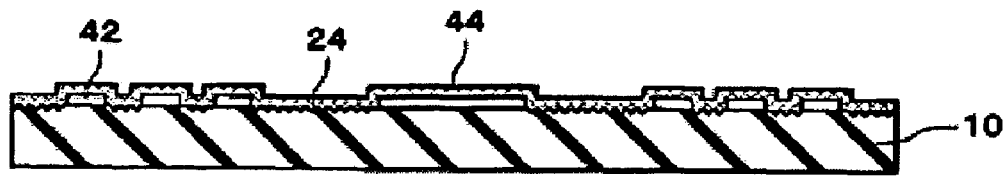
FIG. 12 is a view showing a step of the plating method in accordance with the second embodiment of the invention.

(4) Next, as shown in FIG. 12, a second surface-active agent layer 44 is formed on the roughened area 24 of the substrate 10 and on the first surface-active agent layer 42. In other words, the second surface-active agent layer 44 is formed over the entire surface of the substrate 10.

As the second surface-active agent layer 44, a surface-active agent having a property that exhibits a polarity different from that of the substrate 10 (and the first surface-active agent layer 42) can be used. In other words, as the second surface-active agent layer 44, a cationic system surface-active agent whose surface potential in liquid exhibits a positive potential (second polarity) can be used. When the surface potential of the second surface-active agent layer 44 of this embodiment is assumed to be $+V_3$ (mV) (for example, $+100$ mV), then the surface potential on the roughened area 24 of the substrate 10 becomes to be $-V_1+V_3$ (mV) (for example, $-50+100=50$ mV), and the surface potential on an area other than the roughened area 24 of the substrate 10 becomes to be $-V_2+V_3$ (mV) (for example, $-150+100=-50$ mV). In other words, it is understood at least from observation of potential surfaces that a difference in adsorption amount to be described below occurs due to a difference in potential on the base under the second surface-active agent layer 44, even when the surface of the base is covered by the same second surface-active agent layer 44. In particular, when the relation $|V_2|>|V_1|$ is established as described above, in other words, when the first surface-active agent layer 42 exhibits a stronger negative surface potential than that of the substrate 10, the contrast due to the potential difference becomes clearer.

It is noted that the numerical value of the surface potential of the second surface-active agent layer 44 may be appropriately decided according to the property of the catalyst without any particular limitation, and may have a relation of, for example, $|V_1|<|V_3|<C_2|$.

Figure 13:
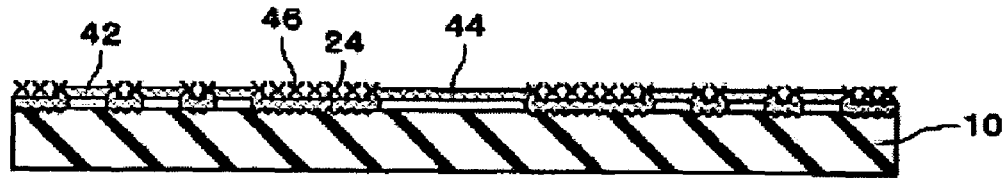
FIG. 13 is a view showing a step of the plating method in accordance with the second embodiment of the invention.

(5) Next, as shown in FIG. 13, a catalyst layer 46 is formed on the roughened area 24 of the substrate 10 and on the second surface-active agent layer 44. When a cationic system surface-active agent is used as the second surface-active agent layer 44, a catalyst whose potential in liquid exhibits a negative potential (first polarity) can be selected. As described above, the second surface-active agent layer 44 is processed such that a difference in adsorption amount of the catalyst occurs due to a difference in the base between the first surface-active agent layer 42 and the roughened area 24 of the substrate 10. In other words, the area where the base is the first surface-active agent layer 42 is in a state in which the property of the second surface-active agent layer 44 is lost because of the property of the first surface-active agent layer 42 (in other words, in a state in which it does not function as a cationic system surface-active agent layer). Accordingly, by dipping the substrate 10 in a catalyst solution containing catalyst composition, the catalyst can be selectively adsorbed onto the roughened area 24. It is noted that the catalyst layer 46 causes precipitation of a metal layer 48 in an electroless plating liquid, and may be composed of, for example, palladium.

Figure 14:
FIG. 14 is a view showing a step of the plating method in accordance with the second embodiment of the invention.

(6) Then, as shown in FIG. 14, the metal layer 48 is precipitated on the catalyst layer 46. As described above, as the catalyst layer 46 is selectively formed on the roughened area 24, the metal layer 48 can be selectively formed on the roughened area 24. It is noted that FIG. 14 omits illustration of the first and second surface-active agent layers 42 and 44, and the catalyst layer 46.

If necessary, after forming the metal layer 48, the first and second surface-active agent layers 42 and 44 in areas other than the metal layer 48 may be removed. The first and second surface-active agent layers 42 and 44 can be removed by the light irradiation step and the washing step described above.

In accordance with the present embodiment, the reliability can be improved with a relatively simple process, like the first embodiment described above. It is noted that the details described in the first embodiment can be similarly applied to other details of the present embodiment.

Third Embodiment

Figure 15:
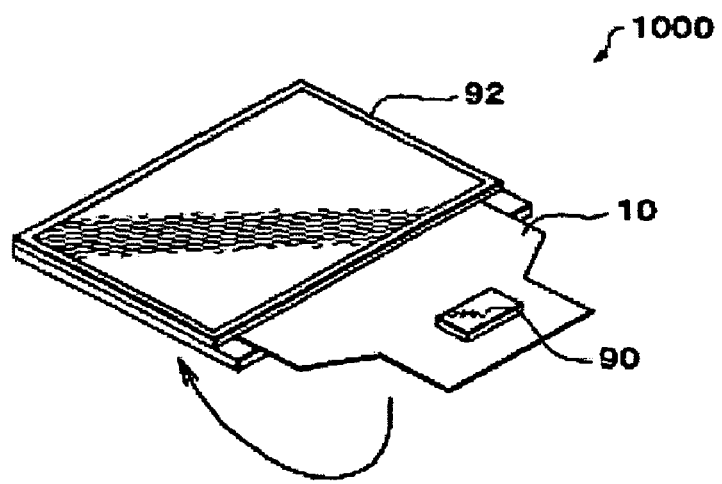
FIG. 15 is a view showing an electronic device in accordance with a third embodiment of the invention.

FIG. 15 is a view showing an example of an electronic device 1000 manufactured by the plating method in accordance with an embodiment of the invention. A wiring pattern (i.e., a metal layer) can be formed on a roughened areas 24 on a substrate 10 by the plating method described above. The wiring pattern may electrically connect electronic components with one another. In this case, the substrate 10 may be a wiring substrate. In other words, a wiring substrate can be formed by the plating method described above. In the illustrated example in FIG. 15, an integrated circuit chip 90 is electrically connected to the substrate 10, and one end section of the substrate 10 is electrically connected to another substrate 92 (for example, a display panel). The electronic device 1000 may be a display device, such as, for example, a liquid crystal display device, a plasma display device, an EL (electroluminescence) display device, or the like.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A plating method comprising the steps of:
   (a) forming a roughened area in a predetermined area of a substrate;
   (b) forming a surface-active agent layer above at least the roughened area;
   (c) forming, above the roughened area, a catalyst layer above the surface-active agent layer; and
   (d) precipitating a metal layer above the catalyst layer
   wherein the step (a) includes forming another surface-active agent layer on an area other than the predetermined area of the substrate, and etching the substrate by wet-etching to thereby form the roughened area.

2. A plating method according to claim 1, wherein the substrate exhibits a first polarity, and the surface-active agent layer and the another surface-active agent layer exhibit a second polarity.

3. A plating method according to claim 2 further comprising removing the another surface-active agent layer before the step (b), and patterning the surface-active agent layer to be remained only above the roughened area in the step (b).

4. A plating method according to claim 2, wherein the step (b) includes patterning the surface-active agent layer by light irradiation in a manner that the surface-active agent layer remains only above the roughened area, and removing the another surface-active agent layer by the light irradiation.

5. A plating method according to claim 1, wherein the substrate and the another surface-active agent layer exhibit a first polarity, and the surface-active agent layer exhibits a second polarity.

6. A plating method according to claim 5, wherein an absolute value of the first polarity of the another surface-active agent layer is greater than an absolute value of the first polarity of the substrate.

7. A plating method according to claim 6, wherein, in the step (b), the surface-active agent layer is formed above the roughened area and above the another surface-active agent layer.

8. A plating method according to claim 1, wherein the roughened area includes irregularities.

* * * * *